United States Patent
Khan et al.

(10) Patent No.: US 10,192,161 B1
(45) Date of Patent: Jan. 29, 2019

(54) LITHIUM-DRIFT BASED RESISTIVE PROCESSING UNIT FOR ACCELERATING MACHINE LEARNING TRAINING

(71) Applicant: INTERNATIONAL BUSINESS MACHINES CORPORATION, Armonk, NY (US)

(72) Inventors: Babar Khan, Ossining, NY (US); Arvind Kumar, Chappaqua, NY (US); Yun Seog Lee, Seoul (KR); Ning Li, White Plains, NY (US); Devendra Sadana, Pleasantville, NY (US); Joel Pereira De Souza, Putam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/840,125

(22) Filed: Dec. 13, 2017

(51) Int. Cl.
   *G06N 3/063* (2006.01)
   *H01L 45/00* (2006.01)
   (Continued)

(52) U.S. Cl.
   CPC .......... *G06N 3/0635* (2013.01); *G06N 3/04* (2013.01); *G06N 3/0445* (2013.01); *G06N 3/08* (2013.01);
   (Continued)

(58) Field of Classification Search
   CPC ............... H01L 45/1206; H01L 45/165; H01L 27/2463; H01L 45/085
   See application file for complete search history.

(56) References Cited

U.S. PATENT DOCUMENTS

| | | | |
|---|---|---|---|
| 8,391,050 B2 * | 3/2013 | Ito | H01L 45/08 257/2 |
| 8,513,720 B2 | 8/2013 | Herman et al. | |

(Continued)

FOREIGN PATENT DOCUMENTS

| | | |
|---|---|---|
| WO | 2007025392 A1 | 9/2005 |
| WO | 2016122523 A1 | 1/2015 |

OTHER PUBLICATIONS

Gokmen, Tayfun, "Training Deep Convolutional Neural Networks with Resistive Cross-Point Devices", May 22, 2017, Published Online <https://arxiv.org/abs/1705.08014/>.

*Primary Examiner* — Allison P Bernstein
(74) *Attorney, Agent, or Firm* — Vazken Alexanian

(57) ABSTRACT

Resistive processing unit including: a plurality of transistors each having a lithium-doped region, wherein the plurality of transistors are arranged in an array to provide resistance; at least one first transmission line electrically connected to a source region of each transistor in at least one column of the array; at least one second transmission line electrically connected to a drain region of each transistor in at least one row of the array; and at least one third transmission line electrically connected to a gate region of the plurality of transistors in at least one row of the array; wherein application of an electrical voltage to the at least one first transmission line, the at least one second transmission line or the at least one third transmission line mobilizes lithium ions in the lithium region, thereby affecting a channel resistance of at least one transistor in the plurality of transistors.

20 Claims, 7 Drawing Sheets

(51) Int. Cl.
*H01L 27/24* (2006.01)
*G06N 3/08* (2006.01)
*G06N 3/04* (2006.01)

(52) U.S. Cl.
CPC ........ *H01L 27/2463* (2013.01); *H01L 45/085* (2013.01); *H01L 45/1206* (2013.01); *H01L 45/148* (2013.01); *H01L 45/165* (2013.01); *H01L 45/1658* (2013.01)

(56) References Cited

U.S. PATENT DOCUMENTS

| | | |
|---|---|---|
| 8,519,376 B2 | 8/2013 | Dimitrov et al. |
| 9,178,142 B2 | 11/2015 | Tendulkar |
| 9,306,166 B1 | 4/2016 | Kim et al. |
| 9,385,162 B2 | 7/2016 | Chung |
| 2013/0079230 A1* | 3/2013 | Poppe ................ H01L 39/145 505/190 |
| 2014/0319452 A1 | 10/2014 | Seabaugh et al. |
| 2016/0118579 A1 | 4/2016 | Chang et al. |
| 2017/0084832 A1 | 3/2017 | Chen et al. |

* cited by examiner

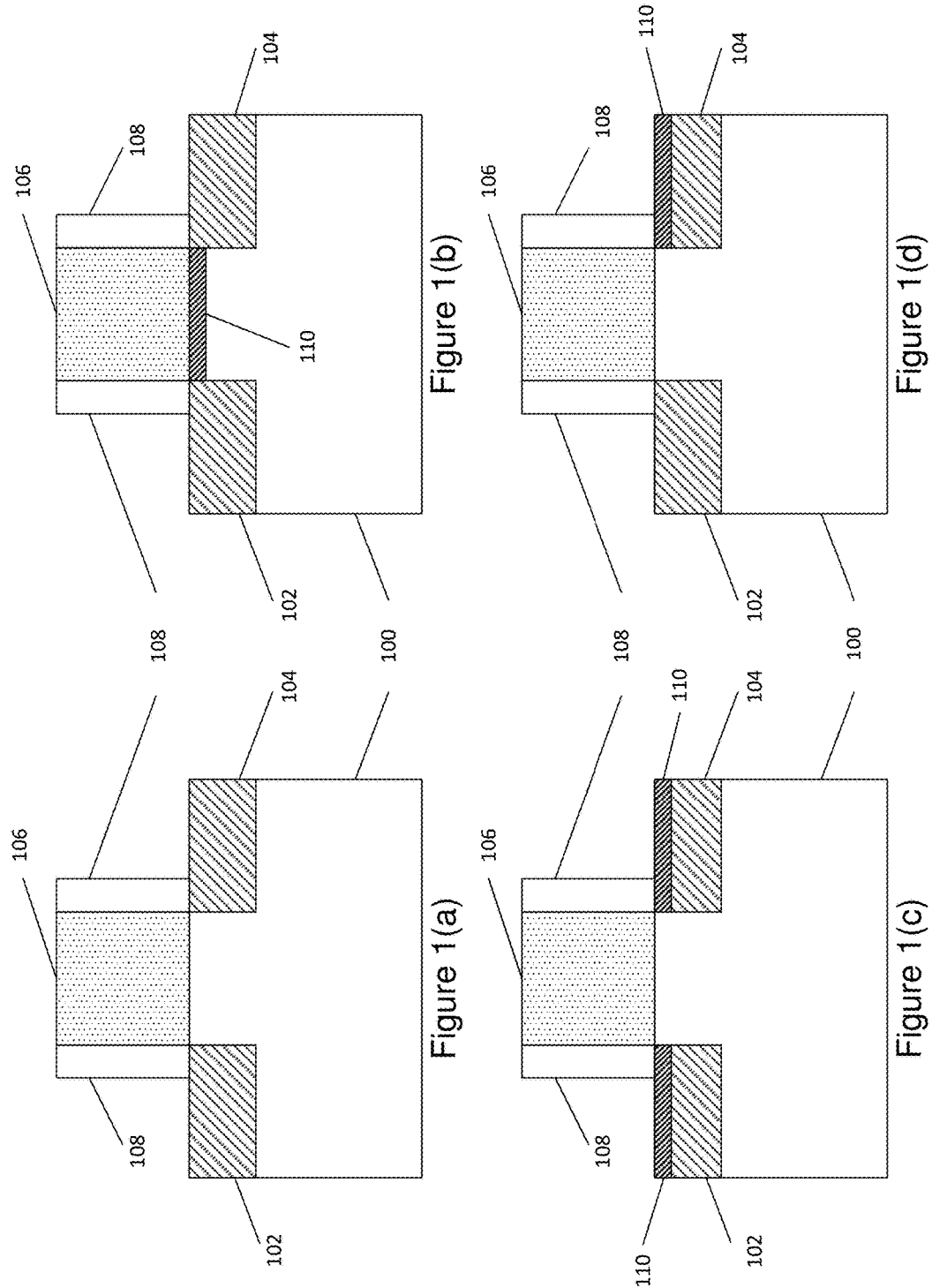

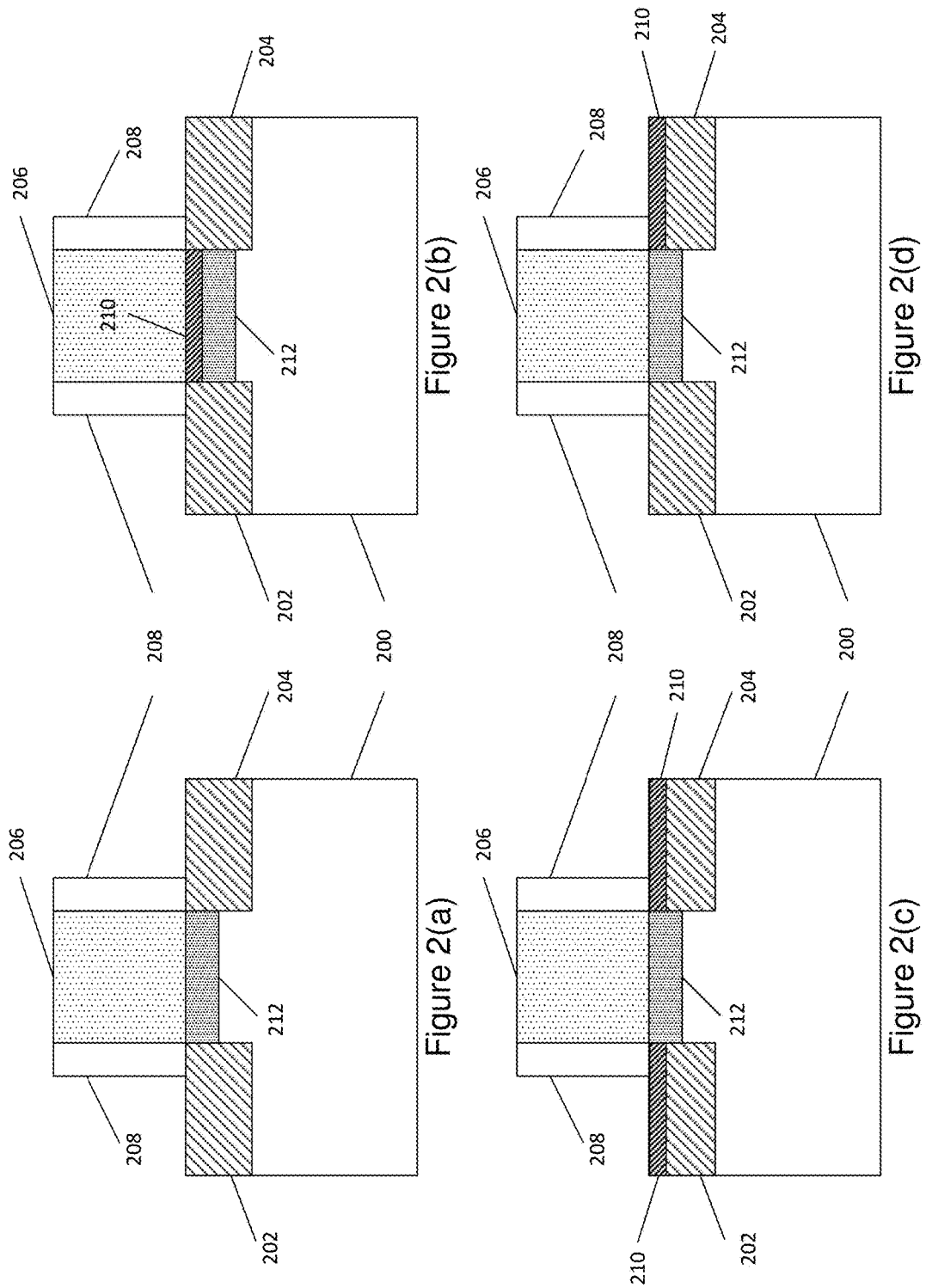

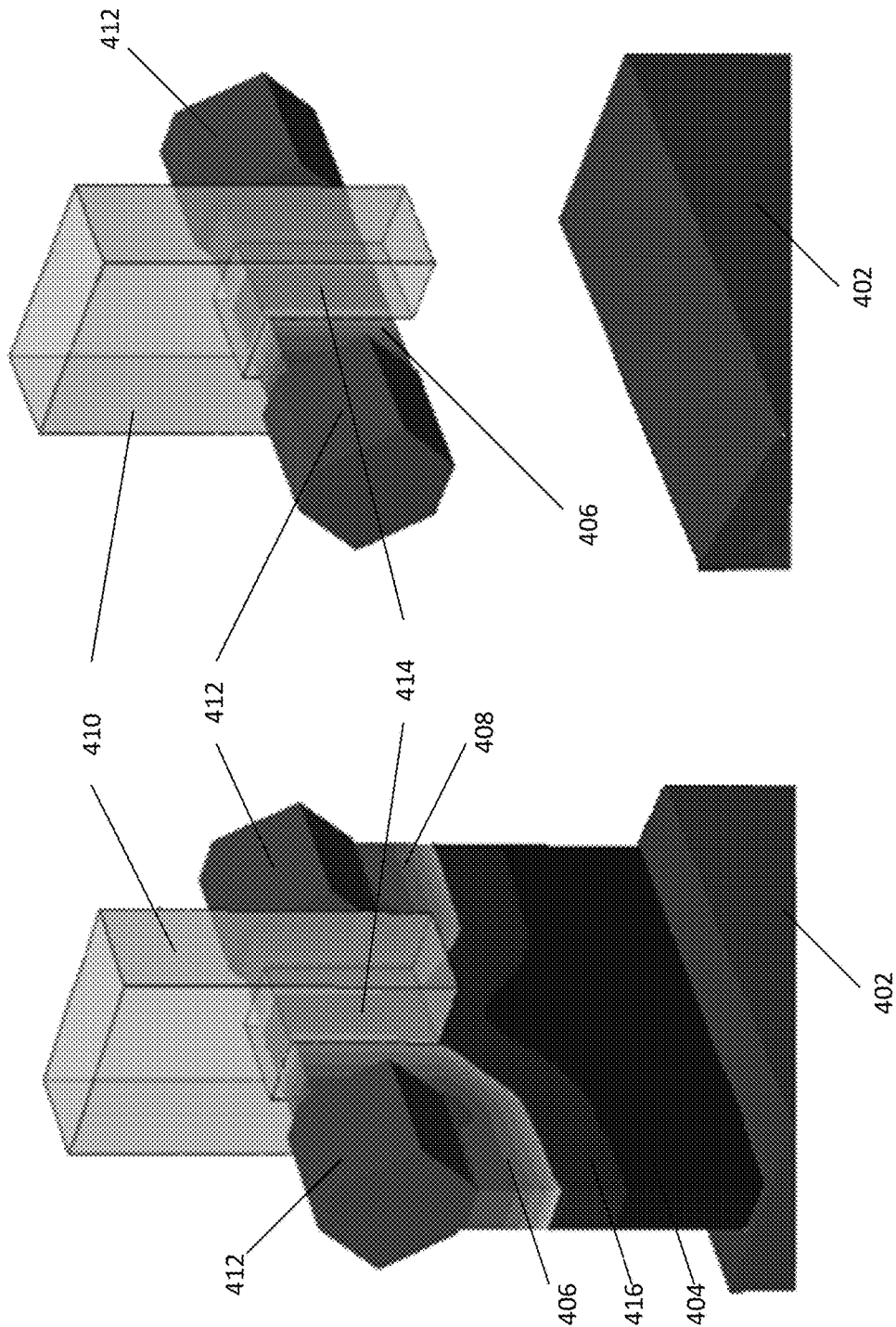

LITHIUM-DRIFT BASED RESISTIVE PROCESSING UNIT FOR ACCELERATING MACHINE LEARNING TRAINING

TECHNICAL FIELD OF THE INVENTION

The present invention relates generally to the field neuromorphic circuits, and in particular, the use of field effect transistors as resistive processing units.

BACKGROUND OF THE INVENTION

Many computer-implemented applications are computationally intensive and require parallel processing. For example, in machine learning or supervised learning, deep neural network (DNN) training techniques typically involve repeated and intensive multiply-accumulate operations with high-latency memory calls. Resistive Processing Units (RPU) are arrays of memory elements that combine processing and non-volatile memory enabling multiply-accumulate operations to be done efficiently in parallel and without extensive data movement between the processor and memory.

SUMMARY OF THE INVENTION

According to one aspect of the present invention, a resistive processing unit is provided. The resistive processing unit includes: a plurality of transistors each having at least one lithium-doped region, wherein the plurality of transistors are arranged in an array to provide resistance; at least one first transmission line electrically connected to a source region of each transistor in at least one column of the array; at least one second transmission line electrically connected to a drain region of each transistor in at least one row of the array; and at least one third transmission line electrically connected to a gate region of the plurality of transistors in at least one row of the array; wherein application of an electrical voltage to the at least one first transmission line, the at least one second transmission line or the at least one third transmission line mobilizes lithium ions in the lithium region, thereby affecting a channel resistance of at least one transistor in the plurality of transistors.

According to another aspect of the present invention, a method for fabricating a resistive processing unit is provided. The method includes: forming a plurality of transistors arranged in an array having a plurality of columns and a plurality of rows, each transistor having a source region, a drain region, a gate region, wherein at least one region includes a lithium-doped region therein; forming at least one first transmission line for electrically connecting the source region of each transistor in at least one column of the plurality of columns in the array; forming at least one second transmission line for electrically connecting the drain region of each transistor in at least one row of the plurality of rows in the array; and forming at least one third transmission line for electrically connecting the gate region of each transistor in at least one row of the plurality of rows in the array; wherein upon applying an electrical voltage to the at least one first transmission line, the at least one second transmission line or the at least one third transmission line, the electrical voltage mobilizes lithium ions in the lithium-doped region, thereby affecting a channel resistance of at least one transistor in the plurality of transistors.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 1(a) depicts a cross-sectional view of a transistor device;

FIG. 1(b) depicts a cross-sectional view of a transistor device according to one or more embodiments of the present invention;

FIG. 1(c) depicts a cross-sectional view of a transistor device according to one or more embodiments of the present invention;

FIG. 1(d) depicts a cross-sectional view of a transistor device according to one or more embodiments of the present invention;

FIG. 2(a) depicts a cross-sectional view of a transistor device;

FIG. 2(b) depicts a cross-sectional view of a transistor device according to one or more embodiments of the present invention;

FIG. 2(c) depicts a cross-sectional view of a transistor device according to one or more embodiments of the present invention;

FIG. 2(d) depicts a cross-sectional view of a transistor device according to one or more embodiments of the present invention;

FIG. 4(a) is a 3-dimensional cross-sectional view of a transistor device that may be used in one or more embodiments of the present invention;

FIG. 4(b) a 3-dimensional cross-sectional view of an silicon on insulator (SOI) transistor device that may be used in one or more embodiments of the present invention;

DETAILED DESCRIPTION OF THE PREFERRED EMBODIMENTS

Figure 3B:
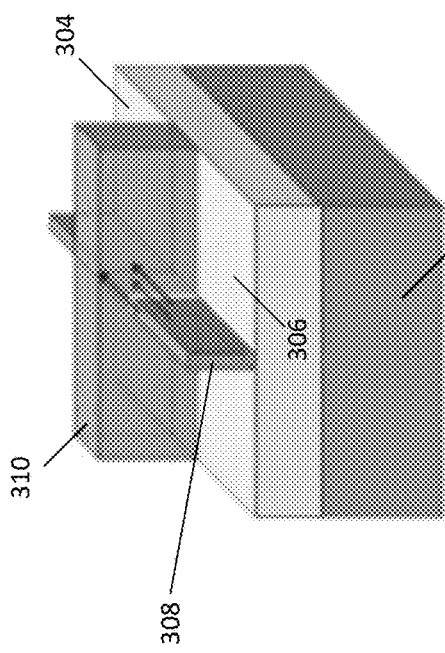
FIG. 3(b) is an example of a type of transistor device that may be used in one or more embodiments of the present invention.

Some preferred embodiments will be described in more detail with reference to the accompanying drawings, in which the preferred embodiments of the present invention have been illustrated. However, the present invention can be implemented in various manners, and thus should not be construed to be limited to the embodiments disclosed herein. On the contrary, those embodiments are provided for the thorough and complete understanding of the present invention, and to completely convey the scope of the present invention to those skilled in the art.

ANNs, also known as neuromorphic or synaptronic systems, are computational systems that can estimate or approximate other functions or systems, including, for example, biological neural systems, the human brain and brain-like functionality such as image recognition, speech recognition and the like. ANNs incorporate knowledge from a variety of disciplines, including neurophysiology, cognitive science/psychology, physics (statistical mechanics), control theory, computer science, artificial intelligence, statistics/mathematics, pattern recognition, computer vision, parallel processing and hardware (e.g., digital/analog/VLSI/optical).

There are many types of neural networks, but the two broadest categories are feed-forward and feedback/recurrent networks. For a non-recurrent feed-forward network having inputs, outputs and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which mean that the signals can travel in both directions using loops. All possible connections between nodes are allowed. Because loops are present in this type of network, under certain operations, it may become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the crosspoint devices of the ANN crossbar array perform the core operations of typical machine learning algorithms. Although a precise definition of machine learning is difficult to formulate, a learning process in the ANN context can be viewed as the problem of updating the crosspoint device connection weights so that a network can efficiently perform a specific task. The crosspoint devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm may be generally defined as the procedure by which learning rules are used to update and/or adjust the relevant weights.

The three main learning algorithm paradigms are supervised, unsupervised and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning.

Deep fully connected neural networks are composed of stacking of multiple fully connected layers such that the signal propagates from input layer to output layer by going through series of linear and non-linear transformations. The whole network expresses a single differentiable error function that maps the input data on to class scores at the output layer. Most commonly the network is trained with simple stochastic gradient descent (SGD), in which the error gradient with respect to each parameter is calculated using the backpropagation algorithm.

Stochastic computing is a collection of techniques that represent continuous values by streams of random bits, wherein complex computations can be computed by simple bit-wise operations on the streams. Specifically, if there are two random and independent bit streams $S_1$, $S_2$ called stochastic numbers (i.e., a Bernoulli process), wherein the probability of a "one" in the first stream is p, and the probability of a "one" in the second stream is q, the logical AND of the two streams can be taken such that the probability of a "one" in the output stream is pq. By observing enough output bits and measuring the frequency of "ones," it is possible to estimate pq to arbitrary accuracy. Because of the design simplicity of these so-called "multiply and accumulate" operations, which can be implemented with a few logic gates/transistors, stochastic computing is often used in the hardware design for neural networks.

For standard resistive processing units, the backpropagation algorithm is composed of three cycles, forward, backward and weight update that are repeated many times until a convergence criterion is met. For a single fully connected layer where N inputs neurons are connected to M output (or hidden) neurons, the forward and backward cycles involve computing a vector-matrix multiplication (y=Wx) where the vector x of length N represents the activities of the input neurons and the matrix W of size M×N stores the weight values between each pair of input and output neurons. The resulting vector y of length M is further processed by performing a non-linear activation on each of the elements and then passed to the next layer. Once the information reaches to the final output layer, the error signal is calculated and backpropagated through the network.

The backward cycle on a single layer also involves a vector-matrix multiplication on the transpose of the weight matrix ($z=W^T\delta$), where the vector of length $\delta$ represents the error calculated by the output neurons and the vector z of length N is further processed using the derivative of neuron non-linearity and then passed down to the previous layers.

Finally, in the update cycle the weight matrix W is updated by performing an outer product of the two vectors that are used in the forward and the backward cycles and usually expressed as W←W+η (δx$^T$) where η is a global learning rate.

All of the above operations performed on the weight matrix W can be implemented with a 2D crossbar array of two-terminal resistive devices with M rows and N columns where the stored conductance values in the crossbar array form the matrix W. As discussed above, in the forward cycle, input vector x is transmitted as voltage pulses through each of the columns and resulting vector y can be read as current signals from the rows. Similarly, when voltage pulses are supplied from the rows as an input in the backward cycle, then a vector-matrix product is computed on the transpose of the weight matrix W$^T$. Finally, in the update cycle voltage pulses representing vectors x and δ are simultaneously supplied from the columns and the rows. At this setting each cross-point device performs a local multiplication and summation operation by processing the voltage pulses coming from the column and the row and hence achieving an incremental weight update.

Turning now to the present invention, resistive processing units are generally implemented using resistive random-access memory, phase change memory, programmable metallization cell memory, non-linear memristive systems, or similar devices. However, fabrication of these types of devices typically involves introduction of new materials and processes into a standard CMOS fabrication process flow and hence are more costly and harder to yield than standard CMOS devices. This disclosure teaches a resistive processing unit implemented using conventional semiconductor devices doped with lithium. The lithium neutralizes p-type doping in semiconductors such as silicon or germanium leading to much lower levels of effective doping. This property is used in the proposed devices to shift the threshold voltage (i.e., transconductance) of the devices to change the "state" of the device. Therefore, embodiments of the present invention provide a method and system for implementing a resistive processing unit using conventional semiconductor devices having lithium-doped regions. The lithium acts as a donor that compensates p-type doping and can be used to shift the threshold voltage and channel resistance controllably in an applied field.

More specifically, the present invention provides a resistive processing unit. The resistive processing unit includes a plurality of transistors each having at least one lithium-doped region and the plurality of transistors are arranged in an array to provide resistance. The source regions of each of the plurality of transistors are electrically connected via a first transmission line in at least one column of the array. The drain regions of each of the plurality of transistors are electrically connected via a second transmission line in at least one row of the array. The gate regions of the plurality of transistors are electrically connected via a third transmission line in at least one row of the array. Thereafter, an electrical voltage can be applied to the at least one first transmission line, the at least one second transmission line or the at least one third transmission line to mobilize the lithium ions in the lithium region, which can change the channel resistance of at least one transistor in the plurality of transistors.

According to various embodiments of the present invention, the lithium-doped regions of each transistor in the plurality of transistors can be located in the channel of each transistor. Alternatively, the lithium-doped regions of each transistor in the plurality of transistors can be located in both the source and drain regions of each transistor or only the drain region of each transistor.

Furthermore, the resistive processing unit of the present invention may include a silicon germanium (SiGe) region in each transistor in the plurality of transistors. The SiGe region may be located in the channel of each transistor or in the source region and drain region of each transistor. In alternative embodiments, the source region and drain region of each transistor may be entirely SiGe.

The resistive processing unit of the present invention may additionally include a substrate contact or back contact for each transistor in the plurality of transistors. The substrate contact or back contact of each transistor in the plurality of transistors can be electrically connected via a fourth transmission line in at least one column of the resistive processing unit. Application of an electrical voltage to the fourth transmission line can mobilize lithium ions in the lithium-doped region, which can affect the channel resistance of a transistor in the plurality of transistors.

The present invention also provides a method for forming a resistive processing unit. The method includes forming a plurality of transistors arranged in an array, where each transistor has a source region, a drain region, a gate region, and a lithium-doped region. The method includes forming at least one first transmission line electrically connecting the source region of each transistor in at least one column of the array, forming at least one second transmission line electrically connecting the drain region of each transistor in at least one column of the array, and forming at least one third transmission line electrically connecting the gate region of each transistor in at least one column of the array. The method also includes mobilizing the lithium ions in the lithium region by applying an electrical voltage to the at least one first transmission line, the at least one second transmission line or the at least one third transmission line, thereby affecting a channel resistance of at least one transistor in the plurality of transistors.

In addition, the method includes forming the lithium-doped region in a channel of each transistor in the plurality of transistors. Alternatively, forming the lithium doped region can be done in the source region and drain region of each transistor or in only the drain region of each transistor.

Furthermore, the method of the present invention provides for forming a silicon germanium (SiGe) region for each transistor in the plurality of transistors. Forming the SiGe region can be done in either the channel of each transistor or the source region and drain region of each transistor or both. Alternatively, the SiGe region can be formed as the source region and drain region of each transistor. The germanium content in each SiGe region can vary and one of ordinary skill in the art would be able to determine the optimal percentage.

The method of the present invention also includes forming a substrate contact for each transistor in the plurality of the transistors and forming at least one fourth transmission line that electrically connects the substrate contact of each transistor in at least one column of the array. Lithium ions in the lithium-doped region can be mobilized by applying an electrical voltage to the fourth transmission line, which can affect a channel resistance of a transistor in the plurality of transistors.

Referring now to FIG. 1(a), a cross-sectional diagram of a transistor device is shown. The transistor device is a conventional semiconductor structure such as a planar field effect transistor (FET) that includes substrate 100, source region 102, drain region 104, gate 106 and spacers 108. The device shown in FIG. 1(a) can be fabricated using processes well-known by one of ordinary skill in the art. The device can be an n-type or p-type FET. Source region 102 and drain region 104 can be formed using silicon, germanium, silicon germanium, or gallium arsenide. FIG. 1(b)-1(d) illustrates the same conventional semiconductor structure as shown in FIG. 1(a) with the addition of lithium-doped region(s) 110. Lithium doping can be carried out using conventional processes such as ion implantation, or alternatively, lithium ions can be diffused into the channel (not shown) before or after deposition of the gate oxide (not shown). Lithium-doped region(s) 110 can be formed in the channel below gate 106, in source region 102 and drain region 104, or solely in drain region 104.

Lithium ions have very high mobility in both germanium and silicon and form interstitial, low ionization energy donors. The present invention uses lithium-doping to compensate p-type germanium and silicon to create wide intrinsic regions. In a typical process, an n-p junction is created in a p-substrate such as germanium or silicon where lithium is diffused into the n-region. The junction can then be reverse biased allowing the lithium ions to drift across the depleted region effectively resulting in an increase in the width of the depletion region as the lithium ions move across.

Referring now to FIG. 2(a), a cross-sectional diagram of a transistor device is shown. The transistor device is a conventional semiconductor structure that includes substrate 200, source region 202, drain region 204, gate 206, spacers 208 and silicon germanium region 212. The device shown in FIG. 2(a) can be fabricated using processes well-known by one of ordinary skill in the art. The device can be an n-type or p-type FET. Source region 202 and drain region 204 can be formed using silicon, germanium, silicon germanium or gallium arsenide. FIG. 2(b)-2(d) illustrates the same conventional semiconductor structure as shown in FIG. 2(a) with the addition of lithium-doped region(s) 210. Lithium doping can be carried out using conventional processes such as ion implantation, or alternatively, lithium ions can be diffused into the channel (not shown) before or after deposition of the gate oxide (not shown). Lithium-doped region 210 can be formed in a channel below gate 206, in source region 202 and drain region 204, or solely in drain region 204.

Figure 3D:
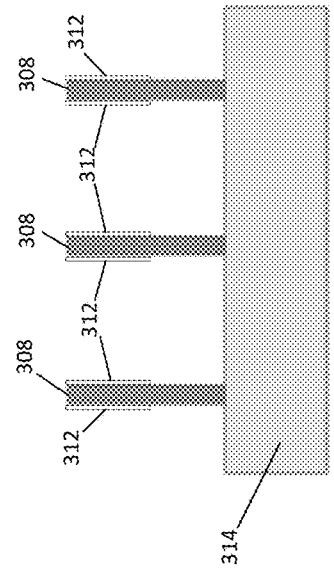
FIG. 3(d) is a cross-sectional view of the transistor device of FIG. 3(c) that may be used in one or more embodiments of the present invention.
Figure 3A:
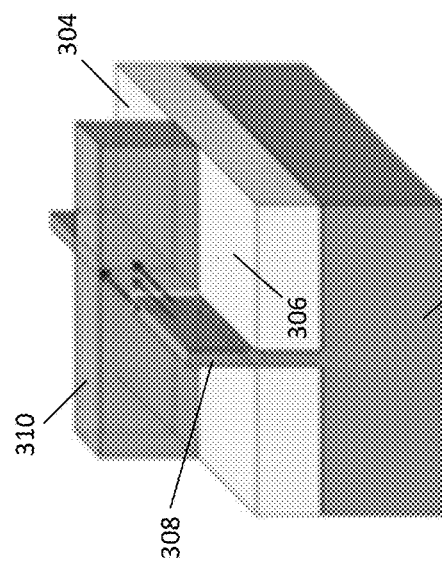
FIG. 3(a) is an example of a type of transistor device that may be used in one or more embodiments of the present invention.
Figure 3C:
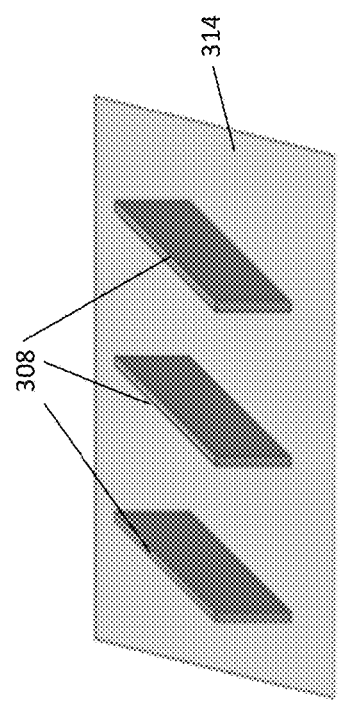
FIG. 3(c) is a 3-dimensional view of the transistor device of FIG. 3(b) shown with a plurality of FIN structures that may be used in one or more embodiments of the present invention.

The semiconductor device used can be either a planar FET or a FinFET. Referring now to FIG. 3(a), a FinFET semiconductor structure in shown having substrate 302, source region 306, drain region 304, fin structure 308 and gate structure 310. Fin structure 308 in FIG. 3(a) is grown from substrate 302 using conventional fabrication processes well-known to one of ordinary skill in the art. In FIG. 3(b), a silicon-on-insulator (SOI) FinFET semiconductor structure is shown having substrate 302, source region 306, drain region 304, fin structure 308 and gate structure 310. Here, fin structure 308 is grown independently of substrate 302 after formation of an oxide layer using conventional fabrication processes well-known to one of ordinary skill in the art. In FIG. 3(c), a 3-dimensional view of the transistor device of FIG. 3(b) is shown with a plurality of fin structures 308 on oxide layer 314. In FIG. 3(d), a cross-sectional view of the transistor device of FIG. 3(c) is shown having oxide layer 314, fin structures 308 and lithium regions 312. The structure of FIG. 3(d) will be discussed further with reference to FIG. 4(a) and FIG. 4(b).

Now referring to FIG. 4(a), a 3-dimensional cross-sectional view of a transistor device is shown. The transistor device is a FinFET semiconductor structure having substrate 402, thermal conduction path 404, sub-fin leakage path 416, source region 406, drain region 408, active fin structure 414, gate structure 410 and lithium implants 412. FIG. 4(b) shows a 3-dimensional cross-sectional view of a transistor device that is an SOI FinFET semiconductor structure having substrate 402, source region 406, active fin structure 414, gate structure 410 and lithium implants 412.

One advantage of the FinFET structure is that lithium implants 412 are confined to the channel by the gate dielectric (not shown) that encapsulates fin structure 414 such that the motion of the lithium ions will be mostly in a lateral direction (i.e., along the length of fin structure 414) when an electrical voltage is applied. The source region and drain region can supply the lithium ions allowing lithium ions to be moved in and out of the channel using gate-to-drain voltage or gate-to-source voltage. The SOI FinFET has an additional advantage in that the bottom of fin structure 414 sits on an insulating layer that can act as a barrier to prevent lithium from leaving the fin structure 414. The fin structure 414 can be fabricated using silicon, silicon germanium, germanium, gallium arsenide of any other semiconducting material used in the manufacture of FinFET devices.

Figure 6:
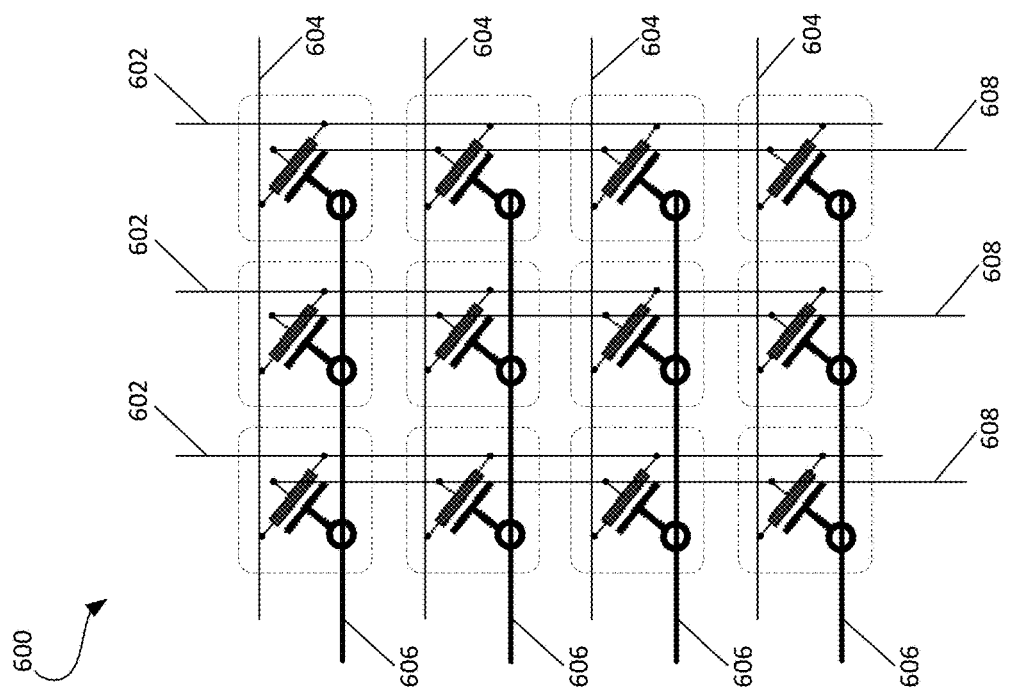
FIG. 6 is a diagram illustrating an array of resistive processing units according to one or more embodiments of the present invention.
Figure 5:
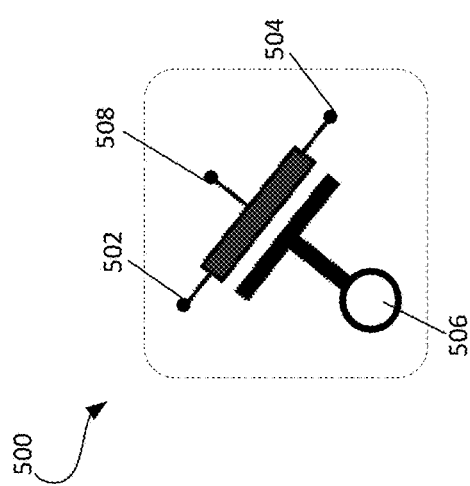
FIG. 5 is a diagram illustrating a resistive processing unit according to one or more embodiments of the present invention.

Referring now to FIG. 5, a diagram illustrating resistive processing unit 500 according to one or more embodiments of the present invention is shown. The diagram of resistive processing unit 500 includes drain region contact 502, source region contact 504, gate contact 506 and optional substrate contact 508. In FIG. 6, resistive processing unit array 600 is shown including a plurality of resistive processing units 500 (see FIG. 5). Resistive processing unit array 600 shows drain region contact 502 of each transistor electrically connected via transmission line(s) 604 in each row of array 600. Source region contact 504 of each transistor is electrically connected via transmission line(s) 602 in each column of array 600. Gate contact 506 of each transistor is electrically connected via transmission line(s) 606 in each row of array 600. Substrate contact 508 can be electrically connected via transmission line(s) 608 in each column of array 600.

Figure 7A:
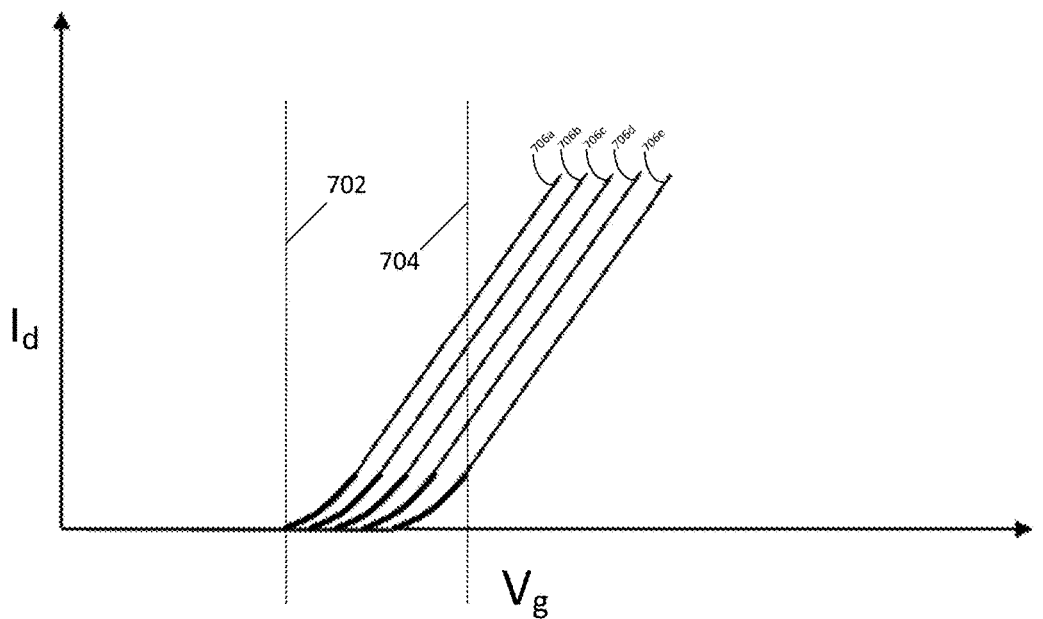
FIG. 7(a) is an example of a graph illustrating the change in threshold voltage of a transistor device according to one or more embodiments of the present invention.
Figure 7B:
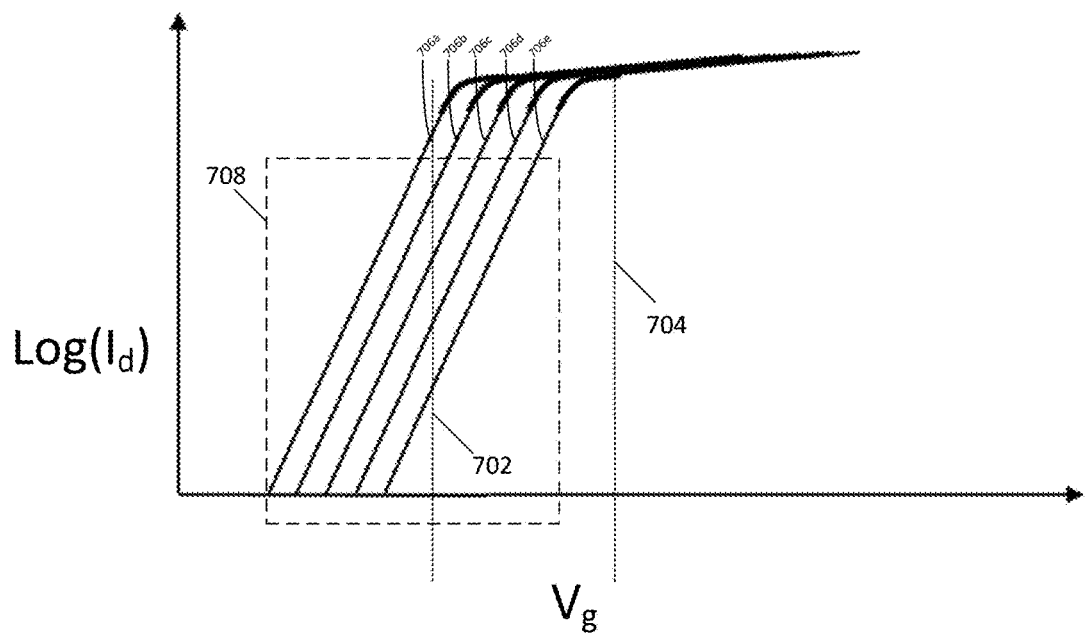
FIG. 7(b) is an example of a graph illustrating the change in threshold voltage of a transistor device plotted on a logarithmic scale according to one or more embodiments of the present invention.

FIGS. 7(a) and 7(b) are examples of a graph illustrating the change in threshold voltage of a transistor device according to various embodiments of the present invention. In FIG. 7(a), the vertical axis of the graph indicates conductance measured at the drain of the transistor device and the horizontal axis indicates the voltage applied to the gate of the transistor device. Diagonal lines 706a-706e show the linear relationship between source-drain conductance and the increase in voltage applied to the gate. Dotted line 702 indicates the un-shifted threshold voltage of the transistor device and diagonal lines 706a-706e show the shift in threshold voltage of the transistor device due to the lithium drift. Here, dotted line 704 indicates the voltage of the read operation and intersects with each diagonal line 706a-706e at different points indicating the change in drain conductance. In FIG. 7(b), the same graph as FIG. 7(a) is shown with the exception that the vertical axis is on the logarithmic scale. Here, subthreshold 708 (dashed square region) more clearly shows the shifting threshold voltage effected by the lithium ion drift.

Figure 8A:
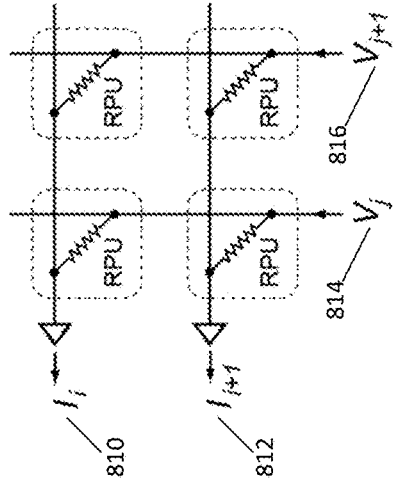
FIG. 8(a) is a diagram showing the forward cycle for the backpropagation algorithm used according to various embodiments of the present invention.
Figure 8C:
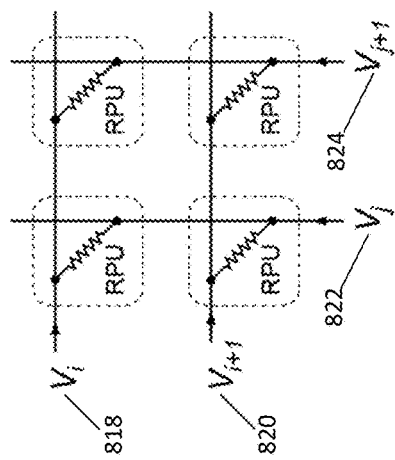
FIG. 8(c) is a diagram showing the weight update for the backpropagation algorithm used according to various embodiments of the present invention.
Figure 8B:
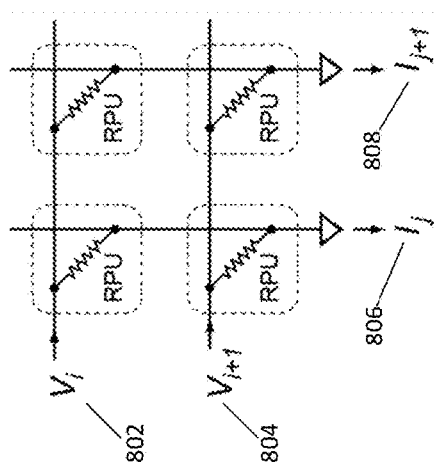
FIG. 8(b) is a diagram showing the backward cycle for the backpropagation algorithm used according to various embodiments of the present invention.

Referring now to FIG. 8(a)-8(c), the forward cycle, backward cycle and weight update for the backpropagation algorithm used for various embodiments of the present invention is shown. FIG. 8(a) shows the forward cycle where $V_i$ 802 and $V_{i+1}$ 804 indicates where voltages would be applied to the resistive processing unit and $I_j$ 806 and $I_{j+1}$ 808 shows where the conductance is read for the resistive processing units such that $I=g\times V$. Figure (b) shows the backward cycle where $V_j$ 814 and $V_{j+1}$ 816 indicates where voltages would be applied to the resistive processing units and $I_i$ 810 and $I_{i+1}$ 812 shows where the conductance is read for the resistive processing units such that $I=g^T\times V$. Lastly, the weight update is shown in FIG. 8(c) where the weight is represented by the conductance of the RPU element and is updated using the equation $g_{ij} \leftarrow g_{ij}+V_i \times V_j$. The error is calculated after the first pass based on the weight update algorithm. Pulses with opposite polarities are applied to the ends ($V_i$ 818, $V_{i+1}$ 820, $V_{ij}$ 822, $V_{ij+1}$ 824) of the resistive processing units during the weight update. The width of the pulses applied at one end is proportional to the calculated error while the other end has stochastic pulses applied to it. When the pulses overlap, a large enough voltage is applied to the device to shift its resistance in the desired direction. If the error was large the probability of overlap over longer periods increases and the resulting shift is larger.

All of the above operations performed on the weight matrix W can be implemented with a 2D crossbar array of two-terminal resistive devices with M rows and N columns where the stored conductance values in the crossbar array form the matrix W. As discussed above, in the forward cycle, input vector V is transmitted as voltage pulses through each of the columns and resulting vector I can be read as current signals from the rows. Similarly, when voltage pulses are supplied from the rows as an input in the backward cycle, then a vector-matrix product is computed on the transpose of the weight matrix $g^T$.

It is important to note that the read operation is the forward pass and backward pass. The read operation should be done with voltages as low as possible to avoid unintentional lithium drift. For instance, the source-drain can be biased in the linear regime (typically <100 mV) and the gate can be biased somewhat above the un-shifted threshold voltage to minimize disturb of the lithium ions and maintain high channel resistance.

In contrast, weight update is the write operation, which is done using stochastic bit streams. There are several ways that different states can be written into a transistor device of the present invention. In various embodiments, a transistor device can have 3-terminal contacts where the state of the device can be written by applying a voltage between the gate and the drain for a sufficient amount of time. Depending on the polarity of the voltage applied, the lithium ions can be moved toward or away from the gate and upon removal of the voltage from the device, the lithium ions would stop moving and the state of the device is written.

In other embodiments of the present invention, a 4-terminal transistor device having a substrate contact in addition to the source contact, drain contact and gate contact can be used. In a 4-terminal transistor device, read and write operations can be decoupled such that for write operations voltage can be applied between the gate contact and the substrate contact to mobilize lithium ions, whereas read operations can be carried out by measuring the source-drain voltage. Embodiments of the present invention implementing 4-terminal transistor devices may be preferable because the use of orthogonal fields for read and write operations would minimize disturb issues.

Parts of one or more embodiments may be a device, a system, a method and/or a computer program product. The computer program product in accordance with one or more embodiments includes a computer readable storage medium (or media) having program instructions thereon for causing a processor to carry out aspects of one or more embodiments.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A resistive processing unit, comprising:
   a plurality of transistors each having at least one lithium-doped region, wherein the plurality of transistors are arranged in an array to provide resistance;
   at least one first transmission line electrically connected to a source region of each transistor in at least one column of the array;
   at least one second transmission line electrically connected to a drain region of each transistor in at least one row of the array; and
   at least one third transmission line electrically connected to a gate region of the plurality of transistors in at least one row of the array;
   wherein application of an electrical voltage to the at least one first transmission line, the at least one second transmission line or the at least one third transmission line mobilizes lithium ions in the lithium region, thereby affecting a channel resistance of at least one transistor in the plurality of transistors.

2. The system of claim 1, wherein the at least one lithium-doped region is located in a channel of each transistor in the plurality of transistors.

3. The system of claim 1, wherein the at least one lithium-doped region is located in the source and the drain of each transistor in the plurality of transistors.

4. The system of claim 1, wherein each transistor in the plurality of transistors further comprises:
   a silicon germanium (SiGe) region.

5. The system of claim 4, wherein the SiGe region is located in at least one of: the channel of each transistor and the source and drain of each transistor.

6. The system of claim 1, wherein each transistor in the plurality of transistors further comprises:
   a substrate contact, wherein the substrate contact of each transistor in the plurality of transistors is electrically connected via a fourth transmission line.

7. The system of claim 6, wherein application of an electrical voltage to the fourth transmission line mobilizes lithium ions in the lithium-doped region, thereby affecting a channel resistance of a transistor in the plurality of transistors.

8. The system of claim 1, wherein the structure of each transistor in the plurality of transistors is a planar field effect transistor.

9. The system of claim 1, wherein the structure of each transistor in the plurality of transistors is a fin field effect transistor.

10. The system of claim 1, wherein the structure of each transistor in the plurality of transistors is a polysilicon thin film transistor.

11. The system of claim 1, wherein the structure of each transistor in the plurality of transistors is an amorphous silicon thin film transistor.

12. The system of claim 1, wherein the structure of each transistor in the plurality of transistors is a poly-germanium thin film transistor.

13. The system of claim 1, wherein the structure of each transistor in the plurality of transistors is an amorphous germanium thin film transistor.

14. A method for forming a resistive processing unit, comprising:
- forming a plurality of transistors arranged in an array having a plurality of columns and a plurality of rows, each transistor having a source region, a drain region, a gate region, wherein at least one region includes a lithium-doped region therein;
- forming at least one first transmission line for electrically connecting the source region of each transistor in at least one column of the plurality of columns in the array;
- forming at least one second transmission line for electrically connecting the drain region of each transistor in at least one row of the plurality of rows in the array; and
- forming at least one third transmission line for electrically connecting the gate region of each transistor in at least one row of the plurality of rows in the array;
- wherein upon applying an electrical voltage to the at least one first transmission line, the at least one second transmission line or the at least one third transmission line, the electrical voltage mobilizes lithium ions in the lithium-doped region, thereby affecting a channel resistance of at least one transistor in the plurality of transistors.

15. The method of claim 14, wherein forming the lithium-doped region of each transistor further comprises:
- forming the lithium-doped region in a channel of each transistor in the plurality of transistors.

16. The method of claim 14, wherein forming the lithium-doped region of each transistor further comprises:
- forming the lithium-doped region in the source and the drain of each transistor in the plurality of transistors.

17. The method of claim 14, further comprising:
- forming a silicon germanium (SiGe) region for each transistor in the plurality of transistors.

18. The method of claim 17, wherein forming the SiGe is in at least one of: the channel of each transistor and the source and drain of each transistor.

19. The method of claim 14, further comprising:
- forming a substrate contact for each transistor in the plurality of transistors; and
- forming at least one fourth transmission line electrically connecting the substrate contact of each transistor in at least one column of the array.

20. The method of claim 19, wherein applying an electrical voltage to the fourth transmission line mobilizes lithium ions in the lithium-doped region, thereby affecting a channel resistance of a transistor in the plurality of transistors.

* * * * *